United States Patent [19]

Anthon et al.

[11] Patent Number: 5,062,117
[45] Date of Patent: Oct. 29, 1991

[54] TAILORED LASER SYSTEM

[75] Inventors: Douglas W. Anthon, Wheaton; Alan T. Eggleston, Batavia; Gregory R. Ristau, Warrenville, all of Ill.

[73] Assignee: Amoco Corporation, Chicago, Ill.

[21] Appl. No.: 551,570

[22] Filed: Jul. 11, 1990

[51] Int. Cl.⁵ .............................................. H01S 3/091
[52] U.S. Cl. ....................................... 372/75; 372/109
[58] Field of Search ..................... 372/69, 71, 75, 26, 372/6, 109

[56] References Cited

U.S. PATENT DOCUMENTS 3,624,545 11/1971 Rosenkrantz et al. ................. 372/26
3,753,145 8/1973 Chester .................................. 372/75
3,982,201 9/1976 Rosenkrantz et al. ................. 372/75
4,731,795 3/1988 Clark et al. ........................... 372/109

Primary Examiner—James W. Davie
Attorney, Agent, or Firm—James A. Gabala; William H. Magidson; Ralph C. Medhurst

[57] ABSTRACT

A laser system comprising: a holder having one end which is adapted to receive pumping light from a source and having an opposite end which transmits laser light to an optical fiber, the holder defining a predetermined axis of propagation which extends between its ends; and a lasant material which is carried by the holder between the ends of the holder and which is located by the holder at an angle which is measured between at least one optical axis and the axis of propagation and which has a magnitude from zero to ninety degrees.

21 Claims, 1 Drawing Sheet

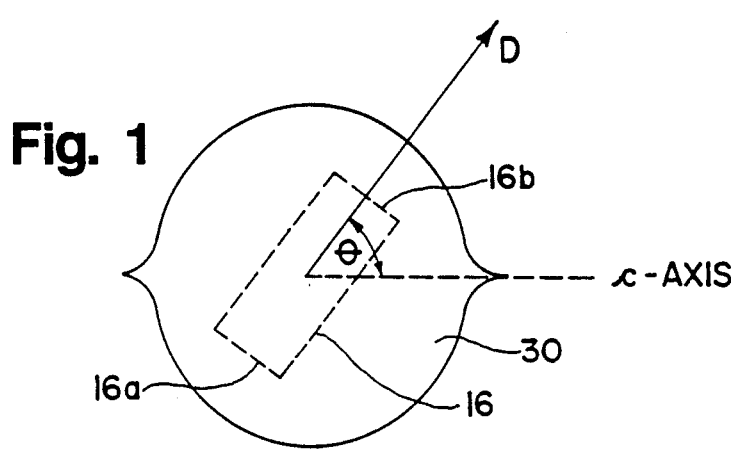
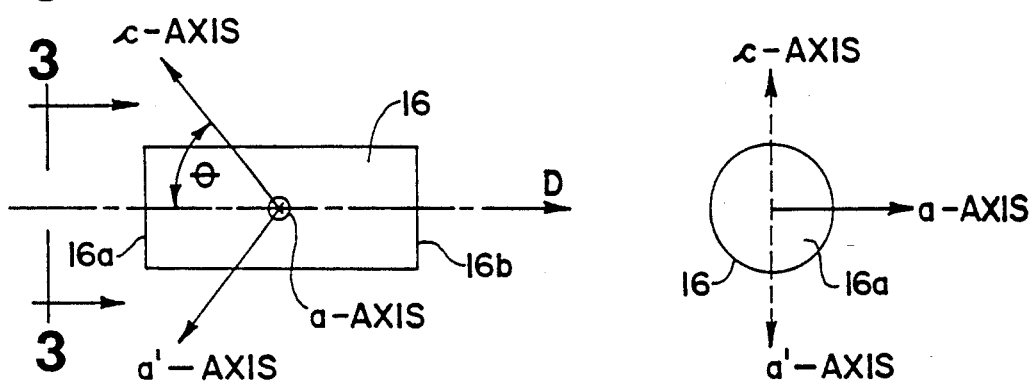
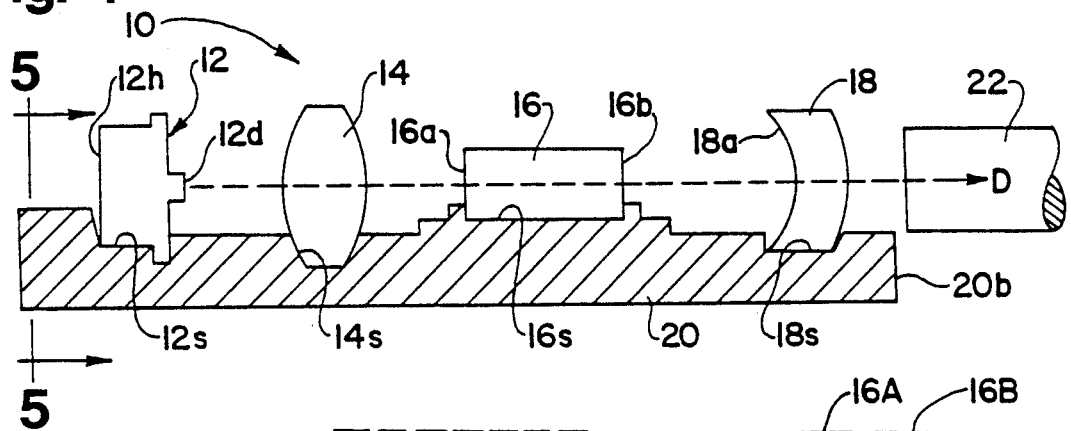
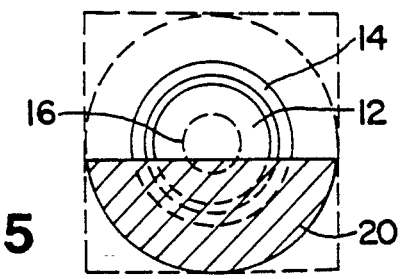
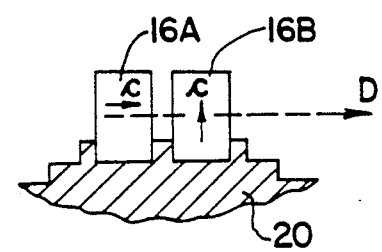

TAILORED LASER SYSTEM

TECHNICAL FIELD

This invention relates to the general subject of lasers and, in particular, to laser systems wherein light is preferably provided or used at a predetermined wavelength.

BACKGROUND OF THE INVENTION

In laser systems it is often desirable to use or provide light at a particular wavelength. By controlling or establishing the wavelength of the laser light, the mode of operation (e.g., Q-switched) can be optimized and the optical noise in the output can be reduced (e.g., reduction in competing modes). In addition, in those systems wherein laser light is transmitted through an optical fiber, the laser's output is preferably at the zero dispersion wavelength or point of the optical fiber in that system.

Diode-pumped neodymium lasers have been shown to be very useful as high powered laser sources for fiberoptic video and microwave transmission. The laser is typically used as a stable continuous-wave (CW) source for an external modulation device, such as a lithium niobate waveguide modulator. In this application it is important that there be no extraneous noise introduced by the laser. The laser must operate in a single transverse mode to eliminate any transverse mode beating. Similarly, the laser must be polarized to avoid beating between frequency-shifted orthogonal modes. Polarization control can also be important for other reasons since, for example, external modulators are often polarization-sensitive. It is also necessary to eliminate mode beating between adjacent longitudinal modes. This can be accomplished by reducing the length of the laser cavity. For example, a 30 GHz bandwidth can be achieved by reducing the round trip cavity optical path length to less than 1 cm. However, cavities this short can be difficult to build, especially when components such as Brewster plate polarizers are used; these components tend to increase the cavity length considerably. Minimization of the laser cavity length is usually easiest in the case of a monolithic laser cavity.

If the laser system works correctly, then the bandwidth of the fiberoptic system is determined by the fiber dispersion properties. The propagation velocity of an optical pulse in a fiber is determined by the group velocity "v" which is defined by $v = c[d(n/\lambda)/d(1/\lambda)]$. In this expression, "c" is the speed of light, "$\lambda$" is the wavelength and "n" is the effective refractive index for the fiber. Because of waveguide effects, the effective value of "n" is dependent on the fiber geometry and it may not be exactly equal to the value for bulk fused silica. The wavelength dependence of "v" is usually described in terms of the dispersion "D" which is defined as $D = dv/d\lambda$. Dispersion is usually expressed for fused silica fibers by an empirical formula, such as $D(\lambda) = (S_0/4)[\lambda - \lambda_0^4/\lambda^3)]$ wherein values for $S_0$ and $\lambda_0$ are supplied by the fiber manufacturer. When $\lambda = \lambda_0$, $D(\lambda)$ equals zero; this is the "zero dispersion wavelength" of the fiber and is typically between 1300 nm and 1320 nm.

In many cases, the optical pulses carrying information through the fiber are not monochromatic; they have a spectral width "$\Delta\lambda$". This width is typically defined as the "Full Width at Half Maximum" (FWHM) value, although with a multi-longitudinal mode laser source, the actual wavelength distribution usually consists of several discrete peaks. Because of dispersion, the different wavelength components of the pulse will propagate with different velocities. This will cause a pulse to broaden as it travels through the fiber. The resulting distortion of the optical signal will reduce the signal modulation depth without reducing the total power. This distortion is characterized by the pulse spread, "$\Delta t$" which is defined by $\Delta t = D(\lambda)[\Delta\lambda/L]$, where "L" is the optical fiber length. It represents the difference in transit times between two pulses with wavelengths $\lambda - (\Delta\lambda/2)$ and $\lambda + (\Delta\lambda/2)$. When $\lambda = \lambda_0$ (i.e., the laser pumps the optical fiber at the zero dispersion wavelength), $D(\lambda) = 0$ and $\Delta t = 0$.

The information bandwidth for the fiber is determined primarily by the pulse spread. If an optical source, with a wavelength distribution consisting of equal peaks at $\lambda - (\Delta\lambda/2)$ and $\lambda + (\Delta\lambda/2)$, is amplitude modulated with a sine wave at a frequency $f = 1/(2\Delta\tau)$, the modulation depth of the output will be zero. This occurs because the output at $\lambda - (\Delta\lambda/2)$ is phase shifted by half a period with respect to that at $\lambda + (\Delta\lambda/2)$. The loss of modulation is less dramatic if a more uniform wavelength distribution is assumed; it is only a factor of two, if a spectrally uniform pulse is used. As a result, the frequency $f = 1/(2\Delta\tau)$ is generally referred to as "the 3-dB optical bandwidth" of the fiber. The fiber transmission bandwidth can be maximized by minimizing either $D(\lambda)$ or $\Delta\lambda$. Preferably, a laser source is selected for supplying the optical fiber such that the laser operates as close as possible to the zero dispersion wavelength (e.g., 1301.5 to 1321.5 nm) of the optical fiber or at $D(\lambda_0) = 0$.

Another problem which occurs in fiber optic applications is that of Stimulated Brillouin Scattering (SBS). Aoki et. al., *J. Opt. Soc. Am. B.*, 5(2), 358-363, (1988). SBS is a nonlinear loss mechanism which becomes important when high power laser sources are propagated through long, low loss optical fibers. The spectral output of a diode-pumped neodymium laser typically consists of several modes with kilohertz linewidths spaced at intervals of several gigahertz. As shown by Aoki et. al., under these conditions, SBS becomes a problem when the power-per-mode exceeds a certain threshold value. Thus, the maximum allowable power in the fiber is determined by the number of oscillating modes in the pump laser as well as the manner in which the power is distributed between these modes. A laser which satisfies these requirements can be accomplished by using a laser material with a relatively broad gain peak, so that several longitudinal modes can operate despite the large frequency spacing required. Of course, the lasing spectrum of a laser can be much narrower than the width of the gain peak. The effects in the laser which tend to drive the laser into multi-longitudinal mode operation (e.g., spatial hole burning) must be carefully optimized if the operating linewidth is to be maximized.

Thus, there are at least three factors which determine the optimum spectral configuration of a laser for fiberoptic applications in the GHz region. Mode beating noise requirements lead to the condition that the mode spacing be as large as possible. The conditions required to suppress SBS suggest the use of a laser material with a relatively broad gain peak, so that several widely spaced longitudinal modes can operate. Finally, the requirement of a large fiber transmission bandwidth leads to the condition that $D(\lambda)\Delta\lambda$ be minimized. In the presence of the required large value of Δλ, this can be satisfied only if the laser is operated at a wavelength where D(λ) is zero. Thus, there is a need for a polarized laser having a short laser cavity which can be made to operate on several widely spaced longitudinal modes and at the zero-dispersion point of the fiber.

Diode-pumped neodymium lasers are very useful high-power sources for fiberoptic video transmission. One particularly useful source of laser light is laser diode pumped, neodymium-doped yttrium lithium fluoride (Nd:YLF or NYLF). The strong 1 μm transitions at 1047 nm and 1053 nm are widely used for applications such as Q-switching, mode locking, and intracavity doubling. The weaker 1.3 μm transitions at 1321 nm and 1313 nm are also of interest; the 1313 nm line is particularly interesting for fiberoptic applications since it is very close to the zero dispersion wavelength $\lambda_o$ in silica fibers.

Birefringent laser crystals, such as Nd:YLF, are characterized by an optical ellipsoid and typically have strongly polarization-dependent gain and absorption spectra. In Nd:YLF, the strongest 1 μm ($^4F_{3/2} \rightarrow ^4I_{11/2}$) transitions are at 1047 nm ($\sigma_\pi = 18 \times 10^{-20}$ cm$^2$), and 1053 nm ($\sigma_\sigma = 12 \times 10^{-20}$ cm$^2$). The corresponding 1.3 μm ($^4F_{3/2} \rightarrow ^4I_{13/2}$) transitions are at 1313 nm ($\sigma_\sigma = 3 \times 10^{-20}$ cm$^2$) and 1321 nm ($\sigma_\pi = 3 \times 10^{-20}$ cm$^2$). In addition, the 800 nm absorption spectrum is strongly polarized. In 1% Nd:YLF the absorption spectra consists of two main peaks, at 792 and 797 nm, with absorption coefficients of $a_\sigma = 1$ cm$^{-1}$, $a_\pi = 9$ cm$^{-1}$ at 792 nm and $a_\sigma = 3$ cm$^{-1}$, $a_\sigma = 6$ cm$^{-1}$ at 797 nm. This makes Nd:YLF easy to pump with a laser diode emitting light at about 800 nm.

Other lasers use a host crystal of yttrium aluminium perovskite (YAlO$_3$ or YAP or YALO). The polarization dependent gain in YALO has been reported, and the lasing characteristics for pumping along principal crystal axes, through the addition of a polarization selective loss in the cavity (e.g., by employing a polarization and wavelength selector, such as a Brewster prism) has been investigated. G. A. Massey et al, *Appl. Phys. Lett.*, Vol. 18, No. 1 (1971). G. A. Massey, *Jour. Quantum Electron.*, Vol. QE-8, No. 7 (1972), p. 669–674, and A. Abramovici, *Optics Comm.*, Vol. 61, No. 6 (1987), p. 401–404. Others have reported the variation of the florescence spectra with polarization and wavelength selectivity in laser cavities employing YALO. M. J. Weber, et al., *Appl. Phys. Letts.*, Vol. 15, No. 10 (1969), p. 342–345. It has been suggested that the anisotropy of the stimulated emission cross sections of the principal axes, for various transitions of Nd doped YAP, can be used in tailoring Nd:YAP for specific laser applications. M. J. Weber, *Appl. Phys.*, Vol. 42, No. 42, (1971), p. 4996–5005. In particular, improved Q-switched operation in a Nd doped YALO laser has been studied, and the dependence of the gain coefficients for Nd in YALO upon the crystallographic orientation of the lasant rod's principal axes and the selection of the crystal axis with optimum gain characteristics has been reported. M. Bass, et al., *Appl. Phys. Letts.*, Vol. 17, No. 9 (1970), p. 395–398. Similar studies of YLF have not been found.

Nd:YLF lasers are typically operated with a ninety degree angle "θ" between the optic axis (i.e., crystal c-axis) and the propagation axis; propagation is along the a-axis, pumping is into the π polarized absorption peak at 792 nm and lasing is with the π polarized 1047 nm transition. With 1 μm cavity reflectors, this usually leads to π-polarized 1047 nm emission with powers between 50 and 100 mW. The output is typically linearly polarized with a polarization ratio of more than 1000:1. Reliable single-line operation at either 1047 nm or 1053 nm can be achieved by aligning a Brewster plate to the π or σ axes of the crystal. Comparable powers can be obtained at either wavelength. Unfortunately, the output polarization is quite sensitive to the alignment of the axes of the Brewster plate to the crystal axes. As can be shown from a Jones matrix analysis, any misalignment results in an elliptically polarized output. Moreover, not only does the Brewster plate increase the overall size/length of the laser source, but also it can decrease the useful power.

1053 nm lasing, σ-polarized, of Nd:YLF can be achieved with $\theta = 0$ degrees (i.e., propagation along the c-axis); however, this has two problems. First of all, the laser is no longer polarized (i.e., it operates in both available polarizations). For mechanical reasons, it is almost impossible to ensure that propagation will be exactly along the c-axis; this leads to a slight degree of birefringence which splits the laser into two sets of orthogonally polarized modes, both of which tend to lase. A second problem relates to the fact that if the laser is propagating along the c-axis, the output power is typically 20% lower than the laser operated with a ninety degree angle to the optic axis. (i.e., $\theta = 90°$). This appears to be due to inefficient pumping, since with $\theta = 0$, only the relatively weak σ-polarized spectrum is accessible. In this configuration, it is also difficult to control the laser's polarization. Adding a Brewster plate to the cavity can suppress one of the polarizations; however, it must be aligned exactly with the difficult-to-find-axes of the crystal, otherwise it will become a Lyot filter. (e.g., Ambramovici, supra, for Nd:YAP) In general, it is easier to add the Brewster plate to the a-axis rod, which is easy to find.

Similar polarized Nd:YLF laser systems can be constructed to operate at 1313/1321 nm. With 200 mW input power, outputs between 25 and 50 mW are typically achieved. When a Nd:YLF laser is made to operate with $\theta = 90$ degrees without a Brewster plate, the laser operates simultaneously on both the σ-polarized 1313 nm line and the π-polarized 1321 nm line. The two lines have virtually identical gain, and they both tend to lase.

This two-line operation is typical of many laser materials at 1.3 μm. For example, a Nd:YAG laser operating at 1319/1338 nm and a Nd:GGG laser operating at 1323/1331 nm. In many materials, single line operation can only be achieved if an additional wavelength-selective element such as a Lyot filter or an etalon is added to the laser cavity. In the case of Nd:YLF, polarization control with a Brewster plate can be used to achieve single line operation at either wavelength. 1313 nm operation can also be achieved by propagating along the c-axis (i.e., $\theta = 90°$), with all the same pumping and polarization problems as the c-axis propagating 1053 nm laser system.

U.S. Pat. No. 3,624,545, issued to Ross on Nov. 30, 1971, describes an optically-pumped solid state laser composed of a Nd:YAG rod which is side-pumped by at least one semiconductor diode laser. Similarly, U.S. Pat. No. 3,753,145, issued to Chesler on Aug. 14, 1973, discloses the use of one or more light-emitting semiconductor diodes to end-pump a neodymium-doped YAG rod. The use of an array of pulsed diode lasers to end-pump a solid lasant material, such as neodymium-doped YAG, is described in U.S. Pat. No. 3,982,201, which was issued to Rosenkranttz et al. on Sept. 21, 1976. Finally D. L. Sipes, *Appl. Phys. Lett.* Vol. 47, No. 2, 1985, pp. 74–75, has reported that the use of a tightly focused semiconductor diode laser array to end-pump a neodymium-doped YAG results in a high efficiency conversion of pumping radiation having a wavelength of about 810 nm to output radiation having a wavelength of 1064 nm.

Thus, although the art has recognized the polarization-dependent gain and absorption spectra of some birefringent laser crystals, such crystals are typically operated at $\theta = 0$ or $\theta = 90$ degrees. More importantly, the efficiencies to be gained by operating an optical fiber at the zero dispersion wavelength $\lambda_o$ has not been linked, in general, to the orientation of a laser crystal relative to the axis of propagation or to how that orientation can be used to optimize the performance of the laser's mode of operation, reduce its optical noise or tailor its optical spectrum.

SUMMARY OF THE INVENTION

One object of the present invention is to provide a novel laser system wherein a laser is coupled into an optical fiber with minimal dispersion losses.

Another object of the invention is to provide a compact, energy efficient laser system using Nd:YLF to supply polarized light to an optical fiber without introducing additional optical elements.

Still another object of the invention is to provide a laser system comprising a birefringent lasant material and a holder for the lasant material which aligns the lasant material to achieve pumping at a zero dispersion wavelength.

Yet another object of the invention is to provide a diode pumped Nd:YLF laser which pumps a fiber optic at about 1.3 $\mu$m, which uses as few components as possible, and which uses simple geometry.

Another object of the invention is to provide a means for tailoring the output spectrum of a laser system.

In accordance with the present invention, disclosure is made of a unique laser system comprising: a holder having one end which is adapted to receive pumping light from a source and having an opposite end which is adapted to transmit laser light to an optical fiber, the holder having a predetermined axis of propagation which extends between its ends; and a lasant material which is carried by the holder at a position between the ends of the holder, the material having at least one optical axis and being located by the holder at an angle which is measured between at least one optical axis and the axis of propagation and which has a magnitude from zero to ninety degrees, the lasant material when receiving light from the source having an optical spectra which includes a dominating polarization dependent spectral peak at a wavelength which is approximately equal to the zero dispersion wavelength of the optical fiber.

Because birefringent solid state lasant materials, such as Nd:YALO or Nd:YLF, typically have strongly polarization dependent absorption spectra and gain coefficients for the transitions of the dopant material, control of the mode of operation of a laser employing such gain media can be achieved by controlling of the polarization or the crystallographic orientation of the lasant material in the laser cavity. In birefringent solid state lasant materials, the gain coefficients are dependent on the angle "$\theta$" subtended by the optical path through the crystal and the crystal's optic axis. Moreover, a parametric relationship exists which expresses the different gain coefficients, for the various transition lines of the doped material in the crystal, in terms of refractive indices of the crystal for the ordinary and the extraordinary polarizations and in terms of trigonometrical function of the angle $\theta$. M. Born and E. Wolf, *Principles of Optics*, Sixth Ed., Chapter 14, Pergamon Press, New York 1980. Therefore, the gain coefficients can be optimized by selecting $\theta$.

One very important use of the present invention is to tailor the output wavelength to the zero dispersion wavelength of the optic fiber which is connected to the laser's output. In accordance with the present invention, the output is polarized without using a Brewster plate and without diverting energy at other wavelengths, the output wavelength of the laser is matched to the zero dispersion wavelength of the optical fiber, and there is reduced frequency beating. Furthermore, since conventional polarization control means, such as a Brewster plate, are not needed, the overall length and size of the laser is reduced.

Numerous other advantages and features of the present invention will become readily apparent from the following detailed description of the invention, the embodiments described therein, from the claims, and from the accompanying drawings.

BRIEF DESCRIPTION OF THE DRAWINGS

FIG. 1 is a plan view of one end of a boule of Nd:YLF showing the orientaion of the crystallographic c-axis of the optical element which forms the lasant material of the present invention;

FIG. 2 is a side view of the optical element of FIG. 1;

FIG. 3 is an end view of the optical element of FIG. 2 as viewed along line 3—"2"—3 of FIG. 2;

FIG. 4 is a schematic drawing of one embodiment of a laser system incorporating the optical element of FIG's 1 through 3;

FIG. 5 is a partial cross sectional end view of the holder in FIG. 4, as viewed along the line 5—5; and FIG. 6 is a partial side view of the holder of FIG. 4 in an embodiment which uses two lasant crystals.

DETAILED DESCRIPTION

While this invention is susceptible of embodiment in many different forms, there is shown in the drawings and will herein be described in detail two specific embodiments of the invention. It should be understood, however, that the present disclosure is to be considered an exemplification of the principles of the invention and is not intended to limit the invention to the specific embodiments illustrated.

OVERVIEW

Turning to FIG. 4, the components of an elementary solid state laser system 10 are illustrated. In particular, that system comprises a pumping source 12, optics 14, a lasant material 16, an output coupler 18, and a holder 20, in this example, for the source, optics, lasant material and output coupler. The holder 20 has one end 20b aligned to transmit light from the lasant material along an axis of propagation D for coupling to an optical fiber 22.

More specifically, optical radiation from the optical pumping means or source 12 is focused by focusing means or optics 14 into one end 16a of the lasant material 16. Preferably the lasant material 16 is a solid state material which is capable of being pumped by optical pumping radiation from a laser diode source. Light emitted by the lasing of the lasant material 16 is contained within the standing wave optical cavity defined by the reflective surface 18a of the output coupler or mirror 18 and a suitable reflective coating on the surface at the opposite end 16a of the lasant material. As will later be explained in detail, the lasant material 16 was constructed by cutting the crystal such that the optical path through the crystal was defined to be at a certain relationship with respect to the crystal's optic axis. (See FIG. 1).

DETAILS

Turning first to the holder or holding means 20, the holder is a support structure for the major components of the laser system 10. In the specific embodiment illustrated, the holder 20 has a plurality of indentations, slots or borings 12s, 14s, 16s and 18s for receiving or carrying the other components of the laser system 10. These slots automatically arrange the components along the optical path, or axis of propagation D, upon their insertion. The components are fixed in position in the holder 20 by using conventional mechanical means, such as set screws or conventional adhesives or bonding agents. Additional details with regard to holders may be found in U.S. Pat. No. 4,731,795 which is assigned to the assignee of the present invention and which is hereby incorporated by reference. From the discussion which follows, those skilled in the art will appreciate that the holder 20 need not provide for the optics 14, and that the output coupler 18 can be carried on one end 16b of the lasant material 16.

Suitable lasant materials 16 include, but are not limited to, solids selected from the group consisting of glassy and crystalline host materials which are doped with an active material and substances wherein the active material is a stoichiometric component of the lasant material. Highly suitable active materials include, but are not limited to, ions of chromium, titanium and the rare earth metals. Detailed summaries of conventional solid lasant materials are set forth in the *CRC Handbook of Laser Science and Technology*, Vol. 1, M. J. Weber, Ed., CRC Press, Inc., Boca Raton, Fla. 1982, pp. 72-135 and by A. A. Kaminskii in *Laser Crystals*, Vol. 14 of the Springer Series in Optical Sciences, D. L. MacAdam, Ed., Springer-Verlag, New York, N.Y., 1981. Conventional host materials for neodymium ions include glass, yttrium aluminum garnet ($Y_3Al_5O_{12}$, referred to as YAG), $YAlO_3$ (referred to as YALO or YAP), neodymium doped $LiYF_4$ (referred to as YLF), $Gd_3Ga_5O_{12}$ (referred to as GGG), and $Gd_3Sc_2Ga_3O_{12}$ (referred to as GSGG). By way of example, when neodymium-doped YAG is employed as the lasant material in an optically-pumped solid state laser system, it can be pumped by absorption of light having a wavelength of about 808 nm and can emit light having a wavelength of about 1064 nm or about 1320 nm.

In the embodiment shown in the drawings, the source 12 comprises a laser diode 12d and an associated heat sink and/or thermoelectric cooler 12h. The use of flashlamps, light-emitting diodes (as used herein, this term includes superluminescent diodes and superluminescent diode arrays) and laser diodes (as used herein, this term includes laser diode arrays) to optically pump or excite a solid lasant material is well-known. Conventional light-emitting diodes and laser diodes are now available which, as a function of composition, produce output radiation having a wavelength over the range from about 630 nm to about 1600 nm. Any such device, which produces optical pumping radiation of a wavelength effective to pump a lasant material 16, can be used in the practice of this invention. For example, the wavelength of a GaAlAs based device can be varied from about 750 nm to about 900 nm by variation of the device's composition. GaAlInp based sources can be used to provide radiation in the wavelength range from about 1000 nm to about 1600 nm using similar methods. It will be appreciated, of course, that during operation the optical pumping means will be attached to a suitable power supply. Electrical leads from the laser source 12 which are directed to a power supply are not illustrated in the drawing.

The function of the optics 14 is to focus light from the source 12 onto the lasant material 16. Any conventional optical means for focusing light can be used. For example, a gradient index lens (GRIN), a ball lens, an aspheric lens or a combination of optical members can be used. If a laser diode 12d is used as a pumping source 12, the output face or end of the laser diode source can be placed in a butt-coupled relationship to input surface or face 16a of the lasant material 16 without the use of optics 14. As used herein, "butt-coupled" is defined to mean a coupling which is sufficiently close such that a divergent beam of optical pumping radiation, emanating from a laser diode source, will optically pump a mode volume within the lasant material 16 with a sufficiently small transverse cross-sectional area so as to support essentially only single transverse mode laser operation (i.e., $TEM_{oo}$ mode operation) in the lasant material.

Light emitted by the lasant material 16 is directed by the output coupler 18 to the optical fiber 22. The optical coupler 18 may be in the form of a mirror which transmits some, but not all, of the light emitted from the lasant material 16. For example it may carry a conventional optical coating on the interior surface 18a which has a reflectivity of about 95 percent. The same sort of coating may be applied to the adjacent end 16b of the lasant material 16. In such case, the output coupler 18 would be replaced by optical means whose principal function would be to collimate or otherwise modify the light for coupling to the optical fiber 22.

The optical fiber 22 is conventional. Examples of telecommunication type optical fibers available commercially from Corning Telecommunications Prod. Div., Corning Glass Works, Corning, N.Y. 14831, U.S.A., are SMF-28 CPC3 Single-Mode Optical Fiber and SMF-21 CPC3 Single-Mode Optical Fiber with typical zero dispersion wavelengths of 1314 nm and 1312 nm respectively.

Returning now to the lasant material 16, unlike conventional practice the lasant material is cut from a crystal boule 30 (e.g., Nd:YLF) such that its crystal axes are at an acute angle $\theta$ to the direction of propagation D (See FIG. 1). Here the lasant material 16 is in the form of a right cylinder or rod. However, it will be appreciated that any conventional geometric shape can be used. In one particular embodiment, the lasant material 16 comprises a Nd:YLF rod 16 having a concentration of Nd of about 1 atomic weight percent. One end 16a is coated for greater than 85% transmission at the wavelength (e.g., 792 nm) of the light emitted from the source 12, and is coated for high reflectivity (HR) at an output wavelength (e.g., 1313 nm) which is approximately equal to the zero dispersion wavelength of the optical fiber 22. The opposite end 16b is coated to be less than 0.25 percent reflective at the output wavelength. In one prototype the lasant material 16 had a diameter of 3 mm and a length of 5 mm.

For an axis of propagation D at an angle $\theta = 45$ degrees relative to the c-axis, the 1313 nm gain in the ordinary ray will be larger than the gain in either line in the extraordinary ray, and polarized single-line lasing can occur. Any angle between about 30 and 60 degrees will accomplish this; these angles reduce the gain in the extraordinary ray by 25% from the peak values. It may actually be advantageous to operate nearer $\theta = 60$ degrees, since this enhances the stronger $\pi$-polarized components of the absorption spectrum. "Walkoff" (i.e., double refraction) provides an additional polarizing-/wavelength selective mechanism. The ordinary and extraordinary modes walk off one another spatially from the input end 16a of the YLF crystal 16. Because of this, it is possible to arrange for either mode to be efficiently overlapped with the pump spot. Assuming the maximum overlap is with the ordinary mode, this will tend to further reinforce the wavelength selective effect.

EXAMPLE

A laser with $\theta = 45$ degrees was constructed using a 4 mm-long laser rod of Nd:YLF having a Nd concentration of about 1%, in a cavity much as that shown in FIG. 4. A curved reflector 18 with a 70 mm radius of curvature and 99.5% reflectivity at 1.32 $\mu$m was used to form a cavity which was 26 mm in length. Laser powers in excess of 25 mW were readily achieved using either 792 or 797 nm pumping. The output beam was linearly polarized with a polarization ratio greater than 1000:1. The spectrum of the output beam was measured with a 0.35 meter monochromator and found to consist of several longitudinal modes centered at 1313 nm. No oscillation at any other wavelength between 1310 and 1400 nm could be detected. The transverse mode profile of the laser output was accurately fit to a Gaussian profile, suggesting that single transverse mode operation had been achieved. This was confirmed by noise measurements using a spectrum analyzer. The noise spectrum showed peaks separated by the 5.34 GHz characteristic of mode beating of the TEM$_{00}$ transverse modes. Those skilled in the art will recognize that this spacing is determined by the cavity length and can be increased by using a shorter cavity. We have also used similar techniques with Nd:YAG to achieve shot-noise-limited operation from 10 MHz to 20 GHz.

FIG. 6 illustrates another embodiment. Here the lasant material comprises two crystals 16A and 16B of Nd:YLF which are located adjacent to each other. One of the crystals 16B is cut to have its c-optical axis at about ninety degrees to the axis of propagation. The other 16A of the two crystals is cut to have its c-optical axis at about zero degrees to the axis of propagation. Surfaces between the two crystals and the surface 16b adjacent to the output coupler 18 are preferably AR coated for 1313 nm and for the wavelength (e.g., 792 nm laser diode) of the source. When so located, the output beam comprises $\sigma$-polarized light at about 1313 nm.

Although the concept of changing the orientation of the lasant materials' crystal axis with respect to the axis of propagation has been described with regard to supplying a fiber optic, this concept has wider application. The polarization dependent gain and absorption spectrum of birefringent solid state lasant crystal hosts can also be used to optimize the mode (e.g., CW, Q-switched) of operation of a laser inasmuch as mode competition and mode fluctuations can be minimized for a desired operating mode.

This concept can also be used to reduce optical noise inasmuch as noise is a function of the adjacent wavelengths at which the laser operates. Moreover, this concept has applicability to both uniaxial and biaxial birefringent laser crystals. Finally, the concept of the invention can be usefully employed wherever a particular or dominate wavelength is desired from a laser crystal (e.g., single wavelength output or single line operation). In particular selecting this wavelength to be essentially the same as the zero dispersion wavelength of an associated optical fiber has immediate practical utility and avoids the introduction of other devices (e.g. Brewster plates, etc) to tailor the output spectra.

From the foregoing description, it will be observed that numerous variations, alternatives and modifications will be apparent to those skilled in the art. Accordingly, this description is to be construed as illustrative only and is for the purpose of teaching those skilled in the art the manner of carrying out the invention. Various changes can be made and specific features of the invention can be modified. For example, the holder can be bored (see FIG. 2 of U.S. Pat. No. 4,731,795) or can have a semi-circular, round, or rectangular cross section (See FIG. 5). Moreover, the reflective surface 18a may be applied as a coating on one end 16b of the lasant material 16. In addition, various changes may be made, materials may substituted and particular features of the invention may be utilized. For example, a polarized 1053 nm laser can be built using Nd:YLF operating with $\theta \approx 30$ degrees. The ordinary ray will see the full ordinary polarized 1053 nm peak, while the extraordinary will see 75% of the 1053 peak and 25% of the 1047 peak. Since the 1047 peak is 1.5 times larger than the 1053 peak, the two peaks in the extraordinary spectrum will both be smaller than the ordinary 1053 nm peak. Thus, polarized 1053 nm operation results. The strongest pump band will occur for extraordinary polarization at 797 nm. Thus, it will be appreciated that various modifications, alternatives, variations, etc., may be made without departing from the spirit and scope of the invention as defined in the appended claims. It is, of course, intended to cover by the appended claims all such modifications involved within the scope of the claims.

We claim:

1. A laser system, comprising:
   a) a holder having one end for receiving pumping light from a source and having an opposite end for transmitting laser light to an optical fiber which is characterized by a zero dispersion wavelength, said holder having a predetermined axis of propagation which extends between its ends; and
   b) a lasant material which is carried by said holder at a position between said ends of said holder, said material having at least one optical axis and being located by said holder at a predetermined angle which is measured between said at least one optical axis and said axis of propagation and which has a magnitude from more than zero to less than ninety degrees, said predetermined angle being selected such that said lasant material when receiving light from said source has an optical spectra which includes a dominating polarization dependent spectral peak at a wavelength which is approximately equal to said zero dispersion wavelength of said optical fiber.

2. The laser system of claim 1, wherein said material comprises Nd:YLF, said predetermined angle is between about 30 degrees and about 60 degrees, said source produces light at a wavelength of approximately 1.3 μm and said zero dispersion wavelength of said optical fiber is approximately 1310 nm.

3. The laser system of claim 2, wherein said holder is generally cylindrical and has a bore which joins its ends, the axis of said bore being aligned to said axis of propagation; and wherein said lasant material is in the shape of a solid cylinder which fits within said bore of said holder and which has two opposite faces.

4. The laser system of claim 3, wherein said cylinder of lasant material has one face which is adjacent to said one end of said holder and which carries means for being optically transmissive of the approximate wavelength of said source and being highly optically reflective at approximately said zero dispersion wavelength.

5. The laser system of claim 4, wherein the opposite face of said material is adjacent to said opposite end of said holder and carries means for being optically transmissive at a wavelength which is approximately said zero dispersion wavelength.

6. The system of claim 1, wherein said lasant material is a crystal which is doped with a rare earth and which is capable of being pumped by laser diode means.

7. The system of claim 6, wherein said lasant material is neodymium-doped lithium yttrium fluoride.

8. The system of claim 1, wherein said lasant material comprises two crystals of Nd:YLF which are located adjacent to each other, one of said crystals being cut to have its optical axis at about ninety degrees to said axis of propagation and the other of said crystals being cut to have its optical axis at about zero degrees to said axis of propagation.

9. The system of claim 1, wherein said predetermined angle is an acute non-zero angle.

10. The system of claim 1, wherein said lasant material is a uniaxial birefringent lasant material.

11. The system of claim 1, wherein said lasant material is characterized by an optical ellipsoid which defines said optical axis.

12. A laser system, comprising:
a) holding means for holding in place a lasant material, said holding means having two opposite sides of which one side is for receiving pumping optical radiation from a source and of which the other of said two sides of said holding means is for transmitting a lasant light output, said sides of said holding means being located generally parallel to each other and defining a propagation axis for the transmission of light from said one side to said other side; and
b) a doped birefringent lasant material which is characterized by an optical ellipsoid, which has a polarization-dependent gain and absorption spectra and which is located in said holding means at a predetermined angle between said propagation axis and at least one of the axes of said optical ellipsoid so as to have one polarized lasant output spectral peak at a predetermined wavelength.

13. The laser system of claim 12, wherein said lasant material comprises a rod of Nd:YLF having a longitudinal axis which coincides with said axis of propagation, having its c-axis located at an acute angle relative to said axis of propagation, and having its a-axis located at right angles to said axis of propagation.

14. The laser system of claim 13, wherein said rod has two substantially parallel ends, one of said ends being positioned in said holding means at a location adjacent to said one side of said holding means to transmit light to fiber optic means having a zero dispersion wavelength approximately equal to said predetermined wavelength.

15. The laser system of claim 14, wherein said one end of said rod is highly reflective at 1313 nm and transmissive at about 792 nm; and wherein said rod has an opposite end which is at least 0.25% reflective at 1313 nm.

16. The laser system of claim 13, wherein said holding means has a generally elongated cylindrical bore which is adapted to carry said rod intermediate said two opposite sides of said holding means.

17. The laser system of claim 12, wherein said source is selected from the group consisting of laser diodes, laser diode arrays, superluminescent diodes and superluminescent diode arrays.

18. The laser system of claim 12, wherein said lasant material comprises two rod like elements of Nd:YLF located end to end with one having said propagation axis aligned with the a-axis of said YLF crystal and with the other aligned with the c-axis of said YLF crystal.

19. The laser system of claim 12, wherein said lasant material comprises a cylindrical rod which is cut from a boule of Nd:YLF and which has a longitudinal axis which is at about 45 degrees to c-axis of the boule.

20. A laser system for supplying an optical fiber, comprising:
(a) a lasant material which is optically pumpable by a source which is characterized by a pumping wavelength, said lasant material having at least one optical axis and having a polarization-dependent gain and absorption spectra which includes a spectral peak at a predetermined wavelength and polarization;
(b) means for forming a laser cavity to lase said material along a direction of propagation and into the optical fiber, said spectral peak having a predetermined characteristic when said direction of propagation is along one crystal axis and another predetermined characteristic when said direction of propagation is along another crystal axis; and
(c) means for tailoring said absorption spectra to the preselected zero dispersion wavelength of the optical fiber by locating said lasant material in said cavity and along said direction of propagation at a predetermined acute non-zero angle between said two crystal axes to have said spectral peak lie between said one predetermined characteristic and said another predetermined characteristic.

21. The laser system of claim 20, wherein said lasant material comprises Nd:YLF which was cut from a boule of Nd:YLF to have said axis of propagation lie at a non-zero acute angle relative to the c-axis of YLF.

* * * * *